United States Patent
Kimura et al.

(10) Patent No.: US 6,542,451 B1
(45) Date of Patent: *Apr. 1, 2003

(54) RETRIEVING DATA FROM A STORAGE DEVICE USING PROGRAMMABLE FILTER AND EQUALIZER

(75) Inventors: Noboru Kimura, Torrance, CA (US); Wen-Yung Yeh, Agoura Hills, CA (US)

(73) Assignee: Discovision Associates, Irvine, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/855,974

(22) Filed: May 14, 1997

Related U.S. Application Data

(60) Continuation of application No. 08/487,730, filed on Jun. 7, 1995, now abandoned, which is a division of application No. 08/238,831, filed on May 6, 1994, now abandoned.

(51) Int. Cl.⁷ .................................................. G11B 7/00
(52) U.S. Cl. ............................... 369/59.16; 369/59.17; 369/124.13; 369/124.15
(58) Field of Search ........................ 369/59.16, 59.17, 369/59.18, 124.05, 124.13, 124.15; 375/229

(56) References Cited

U.S. PATENT DOCUMENTS

| | | | |
|---|---|---|---|
| 3,518,442 A | 6/1970 | Johnson | 250/566 |
| 3,530,258 A | 9/1970 | Gregg et al. | 369/44.19 |
| 3,638,037 A | 1/1972 | McMurtrie | 327/557 |
| 3,772,604 A | 11/1973 | Hogg et al. | 327/180 |
| 4,190,860 A | 2/1980 | Somers et al. | 369/240 |
| 4,210,931 A | 7/1980 | Bailey et al. | 358/342 |
| 4,222,072 A | 9/1980 | Bailey et al. | 358/342 |
| 4,225,873 A | 9/1980 | Winslow | 369/61 |
| 4,232,201 A | 11/1980 | Canino | 369/44.13 |
| 4,232,337 A | 11/1980 | Winslow et al. | 369/44.11 |
| 4,241,455 A | * 12/1980 | Eibner | 359/194 |
| 4,282,598 A | 8/1981 | Elliot | 369/44.11 |
| 4,358,796 A | 11/1982 | Ceshkovsky et al. | 358/322 |
| 4,370,679 A | 1/1983 | Ceshkovsky et al. | 358/318 |
| 4,371,899 A | 2/1983 | Ceshkovsky et al. | 358/315 |
| 4,375,091 A | 2/1983 | Dakin et al. | 369/32 |
| 4,406,000 A | 9/1983 | Shoji et al. | 369/44.25 |
| 4,414,655 A | 11/1983 | Shoji et al. | 369/44.25 |

(List continued on next page.)

FOREIGN PATENT DOCUMENTS

| | | |
|---|---|---|
| CA | 833100 | 1/1970 |
| EP | 51343 | 5/1982 |
| EP | 466329 | 1/1992 |
| GB | 2098379 | 11/1982 |
| JP | 60-070552 | 4/1985 |
| JP | 60-197908 | 10/1985 |
| JP | 61045415 | 3/1986 |
| JP | 61210563 | 9/1986 |
| JP | 63-069067 | 3/1988 |
| JP | 03120673 | 5/1991 |
| JP | 1628236 | 12/1991 |
| JP | 1670392 | 6/1992 |

Primary Examiner—Aristotelis M. Psitos
(74) Attorney, Agent, or Firm—Keiji Masaki; Steve A. Wong; Caroline T. Do

(57) ABSTRACT

An equalizer for producing an equalized signal from an input signal. The input signal has a DC component. The equalizer includes a programmable filter and equalizer. A detector for generating a threshold signal from a preprocessed signal. The preprocessed signal is generated from the equalized signal. A comparator for comparing the preprocessed signal to the threshold signal to produce an output signal. A tracking device for tracking the DC component from the output signal.

22 Claims, 13 Drawing Sheets

U.S. PATENT DOCUMENTS

| | | | |
|---|---|---|---|
| 4,439,848 A | 3/1984 | Ceshkovsky et al. | 369/44.29 |
| 4,451,913 A | 5/1984 | Elliott | 369/110 |
| 4,456,914 A | 6/1984 | Winslow | 347/255 |
| 4,467,467 A | 8/1984 | Wilkinson et al. | 369/111 |
| 4,488,279 A | 12/1984 | Wilkinson et al. | 369/54 |
| 4,499,569 A | 2/1985 | Lopez De Romana | 369/44.23 |
| 4,499,570 A * | 2/1985 | Immink et al. | 360/38.1 X |
| 4,536,863 A | 8/1985 | Giddings | 369/43 |
| 4,550,346 A | 10/1985 | Hatano | 358/330 |
| RE32,051 E | 12/1985 | Ceshkovsky et al. | 369/44.28 |
| 4,571,716 A | 2/1986 | Szerlip | 369/54 |
| 4,583,210 A | 4/1986 | Winslow | 369/54 |
| 4,588,905 A | 5/1986 | Kojima | |
| 4,611,318 A | 9/1986 | Winslow | 369/54 |
| 4,638,377 A | 1/1987 | Datin | 358/343 |
| RE32,431 E | 6/1987 | Dakin et al. | 358/338 |
| 4,701,898 A | 10/1987 | Giddings | 369/32 |
| 4,703,368 A | 10/1987 | Dakin | 358/342 |
| 4,703,467 A | 10/1987 | Elliot | 369/44.25 |
| 4,706,133 A | 11/1987 | Giddings | 358/342 |
| RE32,574 E | 1/1988 | Ceshkovsky et al. | 369/32 |
| 4,727,433 A | 2/1988 | Dakin | 358/343 |
| 4,727,532 A | 2/1988 | Giddings | 358/342 |
| 4,751,692 A | 6/1988 | Giddings | 369/32 |
| RE32,709 E | 7/1988 | Cashkovsky et al. | 369/44.26 |
| 4,757,393 A | 7/1988 | Dakin et al. | 358/342 |
| 4,774,699 A | 9/1988 | Giddings | 369/32 |
| 4,809,147 A | 2/1989 | Elliott | 369/44.11 |
| 4,809,247 A | 2/1989 | Elliott | 369/44.11 |
| 4,811,280 A | 3/1989 | Berkowitz et al. | 395/440 |
| 4,845,697 A | 7/1989 | Giddings | 369/32 |
| 4,928,187 A | 5/1990 | Rees | 360/40 |
| 4,972,276 A | 11/1990 | Wadaya et al. | 360/66 |
| 4,998,011 A | 3/1991 | Shuman | 250/201.5 |
| 5,003,526 A | 3/1991 | Bailey | 369/59 |
| 5,084,852 A | 1/1992 | Bailey | 369/59 |
| 5,099,464 A | 3/1992 | Maeda | 369/13 |
| 5,101,395 A * | 3/1992 | Cardero et al. | 369/59 |
| 5,109,373 A | 4/1992 | Ohno et al. | 369/100 |
| 5,136,558 A | 8/1992 | Getreur et al. | 369/44.15 |
| 5,155,633 A | 10/1992 | Grove et al. | 359/854 |
| 5,159,340 A | 10/1992 | Smith | 341/132 |
| 5,177,640 A | 1/1993 | Grassens | 359/814 |
| 5,192,922 A * | 3/1993 | Jordan | 332/109 |
| 5,204,848 A | 4/1993 | Cardero et al. | 369/48 |
| 5,245,174 A | 9/1993 | Prikryl et al. | 250/201.5 |
| 5,253,244 A | 10/1993 | Bailey | 369/59 |
| 5,289,455 A | 2/1994 | Kuroda et al. | 369/126 |
| 5,303,217 A | 4/1994 | Bakx et al. | 369/48 |
| 5,313,332 A | 5/1994 | Schell et al. | 359/813 |
| 5,321,559 A * | 6/1994 | Nguyen et al. | 360/46 |
| 5,321,680 A | 6/1994 | Bailey | 369/59 |
| 5,331,622 A | 7/1994 | Ernst et al. | 369/112 |
| 5,349,175 A | 9/1994 | Prikryl | 250/201.5 |
| 5,365,505 A * | 11/1994 | Fuji | 369/59.17 |
| 5,373,490 A | 12/1994 | Bailey | 369/59 |
| 5,375,116 A | 12/1994 | Bailey | 369/275.3 |
| 5,396,479 A | 3/1995 | Johann | 369/59 |
| 5,400,318 A | 3/1995 | Nakayama et al. | 369/275.3 |
| 5,448,544 A | 9/1995 | Tsuchinaga et al. | 369/59 |
| 5,448,545 A | 9/1995 | Bailey | 369/59 |
| 5,479,390 A | 12/1995 | Bailey | 369/59 |
| 5,659,535 A * | 8/1997 | Kimura et al. | 369/59.17 X |
| 5,706,267 A * | 1/1998 | Kimura et al. | 369/59.17 |
| 5,790,495 A * | 8/1998 | Kimura et al. | 369/59.18 |
| 5,894,468 A * | 4/1999 | Kimura et al. | 369/124.05 X |

* cited by examiner

RETRIEVING DATA FROM A STORAGE DEVICE USING PROGRAMMABLE FILTER AND EQUALIZER

This application is a continuation of U.S. patent application Ser. No. 08/487,730, now abandoned, a divisional of U.S. patent application Ser. No. 08/238,831 filed May 6, 1994, now abandoned.

FIELD OF THE INVENTION

This invention relates to storage and retrieval of data stored on various magnetic and/or electronic media and, more particularly, to a method and apparatus for storing and retrieving data in a magneto-optical disk system.

BACKGROUND OF THE INVENTION

Various types of recordable and/or erasable media have been used for many years for data storage purposes. Such media may include, for example, magnetic tapes or disks in systems having a variety of configurations.

Magneto-optical ("MO") systems exist for recording data on and retrieving data from a magnetic disk. The process of recording in a magneto-optical system typically involves use of a magnetic field to orient the polarity of a generalized area on the disk while a laser pulse heats a localized area, thereby fixing the polarity of the localized area. The localized area with fixed polarity is commonly called a pit or mark. Some encoding systems use the existence or absence of a pit or mark on the disk to define the recorded data as a "1" or "0", respectively.

When recording data, a binary input data sequence may be converted by digital modulation to a different binary sequence having more desirable properties. A modulator may, for example, convert m data bits to a code word with n modulation code bits (or "binits"). In most cases, there are more code bits than data bits —i.e., m<n.

Most if not all disk drive systems use run-length-limited ("RLL") modulation codes, such as RLL 2/7 or RLL 2/7/1/2 codes. Another family of modulation codes are group-coded recording ("GCR") codes, such as GCR 8/9 or GCR 0/3/8/9 codes. The numbers appended to the names of particular codes typically refer to certain encoding constraints, such the relationship between bits and flux reversals, or the minimum and maximum number of contiguous binits possible without flux transitions. For example, a commonly used encoding system for pit-type recording is the RLL 2/7 code which constrains the recorded information to have a minimum of two and a maximum of seven zeroes between ones. In general, RLL recording provides a relatively high data-to-pit ratio but may not, however, in many circumstances allow for high data storage densities because amplitude and timing margins deteriorate very rapidly as frequency is increased.

A GCR 8/9 code, on the other hand, requires nine flux reversals for every eight data bits. The GCR 0/3/8/9 code imposes the same constraints as the GCR 8/9 code but further requires a minimum of no zeroes and a maximum of three zeroes between ones.

The density ratio of a given recording is often expressed according to the equation $(m/n) \times (d+1)$, where m and n have the definitions provided above, and d is defined as the minimum number of zeroes occurring between ones. Thus, the RLL 2/7/1/2 code has, according to the above equation, a density ratio of 1.5, while the GCR 0/3/8/9 code has a density ratio of 0.89.

For reading data in an MO system, a focused laser beam or other optical device is typically directed at the recording surface of a rotating optical disk such that the laser beam can selectively access one of a plurality of tracks on the recorded surface. The rotation of the laser beam reflected from the recorded surface may be detected by means of Kerr rotation. A change in Kerr rotation of a first type, for example, represents a first binary value. A change in Kerr rotation of a second type represents a second binary value. An output signal is generated from the first and second binary values occurring at specified clock intervals.

Although there has been a continual demand for disk systems capable of storing increasingly higher data densities, the ability to achieve high data storage densities has met with several limitations. As a general matter, the reasonable upper limit for data density is determined in part by reliability requirements, the optical wavelength of the laser diode, the quality of the optical module, hardware cost, and operating speed. Maximum data densities are also affected by the ability to reject various forms of noise, interference, and distortion. For example, the denser that data is packed, the more intersymbol interference will prevent accurate recovery of data. Moreover, because the technology for many intermediate and high performance optical disk drives has been limited by downward compatibility constraints to older models, signal processing techniques have not advanced as rapidly as they might have otherwise.

When attempting to recover stored data, existing read channels of magneto-optical and other types of disk drives commonly suffer from a number of problems due to the unintended buildup of DC components in the read signal. One cause of DC buildup results from the recording of asymmetric data patterns over a number of bytes or data segments. A symmetric data pattern may be considered as one having an average DC component of zero over a region of interest. Because sequences of recorded bits may be essentially random in many modulation codes, however, localized regions of recorded data having particular patterns of 1's and 0's will produce an asymmetric read signal having unwanted DC components. Because the data patterns vary over time, the level of DC buildup will also vary, causing wander of the DC baseline, reduction of threshold detection margins, and greater susceptibility to noise and other interference.

Undesired DC buildup is also caused by variance in pit size due to thermal effects on the wiring laser or the storage medium. As the writing laser heats up, for example, the spot size may increase leading to wider pits or marks. When the recorded pits are read, variations in pit size will cause an asymmetric input signal having DC components. Variation in pit size not only causes undesired DC buildup but also causes the relative locations of the data to appear shifted in time, reducing the timing margin and leading to possible reading errors.

Various attempts have been made to overcome the described problems. For example, various tape drive systems commonly use a DC-free code such as a 0/3/8/10 code, otherwise referred to simply as an 8/10 code. Because an 8/10 code requires 10 stored bits to yield 8 data bits, however, it is only 80% efficient which is a drawback when attempting to record high data densities.

Another method for handling DC buildup involves the use of double differentiation. This method typically involves detection of the peaks of a first derivative of the input signal by detecting zero-crossings of the second derivative of the input signal. Thus, the DC components are effectively filtered out. One drawback of this method is that differentiation or double differentiation can cause undesirable noise effects. A second drawback is that the method may decrease the timing margin to unacceptably low levels (e.g., by as much as 50 percent).

In another method for addressing DC buildup, the data to be stored is randomized prior to recording such that none of the data patterns repeat over a data sensor. However, this method may not be acceptable by ISO standards and may lack downward compatibility with previous disk drive systems. As a further drawback to this method, de-randomizing the data may be complex.

Yet another method for controlling DC buildup involves the use of so-called resync bytes between data segments. This method generally involves the examination and manipulation of data before it is recorded in order to minimize DC buildup upon readback. Before recording, two consecutive data segments are examined to determine if the patterns of 1's and 0's are such as to cause positive DC, negative DC, or no DC components when read back. If, for example, two consecutive data segments have the same dc polarity, one of the data segments is inverted prior to being recorded on the medium. In order to stay within the constraints of the particular encoding system, however, a resync byte between the segments may need to be written so that the pattern of contiguous bits and flux reversals is proper. A drawback of such a method is that it will not necessarily reduce all DC buildup, and time constants must be determined such that the predictable DC buildup will not affect performance. Further, the method requires additional overhead including the examination of data segments to determine their relative polarity.

It would therefore be advantageous to have a method and device for reading stored data from a medium without suffering the undesirable effects of DC buildup, without creating unacceptable levels of noise or significantly reducing timing margins, without the requirement of large amounts of overhead or de-randomizing algorithms, while providing high data storage efficiency.

SUMMARY OF THE INVENTION

An apparatus and method is provided for retrieving densely stored data from various types of magnetic media. One embodiment of the invention generally comprises the steps of differentiation, equalization, partial integration, and data generation. The steps of differentiation, equalization and partial integration may generally provide a preprocessed signal corresponding to a playback signal but with better resolution and reduced noise. Data generation may further comprise the steps of detecting the positive and negative peaks of the preprocessed signal in a manner so as to account for the DC component, and generating a threshold corresponding to the midpoint of the measured positive and negative peak values. The method further may involve the step of feeding back a signal indicative of variations in the duty cycle of the output signal so as to enable tracking of the DC component by positive and negative peak detection circuits.

DETAILED DESCRIPTION OF THE SPECIFIC EMBODIMENTS

Although the present invention is applicable to many different data storage and retrieval systems, the following description of the preferred embodiment will focus primarily on magneto-optical systems. In so doing, there is not intent to limit the scope of the invention solely to devices which are magneto-optical in nature.

A detailed system for storing and retrieving data from a magneto-optical device is provide in related application Ser. No. 07/964,518 filed Jan. 25, 1993, now U.S. Pat. No. 5,537,379, which is incorporated by reference as if fully set forth herein.

Figure 1:
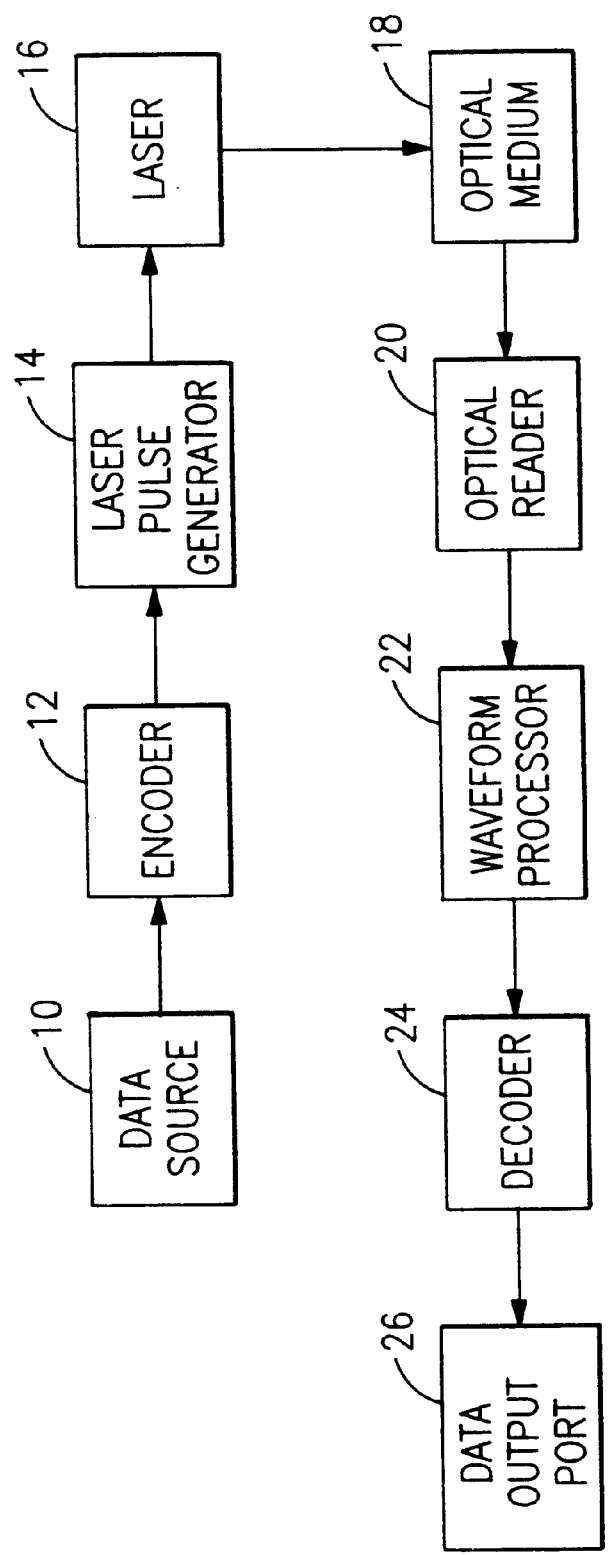
FIG. 1 is a block diagram showing an optical data storage and retrieval system.

A block diagram of an exemplary magneto-optical system is shown in FIG. 1. The system may have a read mode and a write mode. During the write mode, a data source 10 transmits data to an encoder 12. The encoder 12 converts the data into binary code bits. The binary code bits are transmitted to a laser pulse generator 14, where the code bits may be converted to energizing pulses for turning a laser 16 on and off. In one embodiment, for example, a code bit of "1" indicates that the laser will be pulsed on for a fixed duration independent of the code bit pattern, while a code bit of "0" indicates that the laser will not be pulsed at that interval. Depending on the particular laser and type of optical medium being used, performance may be enhanced by adjusting the relative occurrence of the laser pulse or extending the otherwise uniform pulse duration. In response to being pulsed, the laser 16 heats localized areas of an optical medium 18, thereby exposing the localized areas of the optical medium 18 to a magnetic flux that fixes the polarity of the magnetic material on the optical medium 18. The localized areas, commonly called "pits" or "marks", store the encoded data in magnetic form until erased.

During the read mode, a laser beam or other light source is reflected off the surface of the optical medium 18. The reflected laser beam has a polarization dependent upon the polarity of the magnetic surface of the optical medium 18. The reflected laser beam is provided to an optical reader 20, which sends an input signal or read signal to a waveform processor 22 for conditioning the input signal and recovering the encoded data. The output of the waveform processor 22 may be provided to a decoder 24. The decoder 24 translates the encoded data back to its original form and sends the decoded data to a data output port 26 for transmission or other processing as desired.

Figure 2:
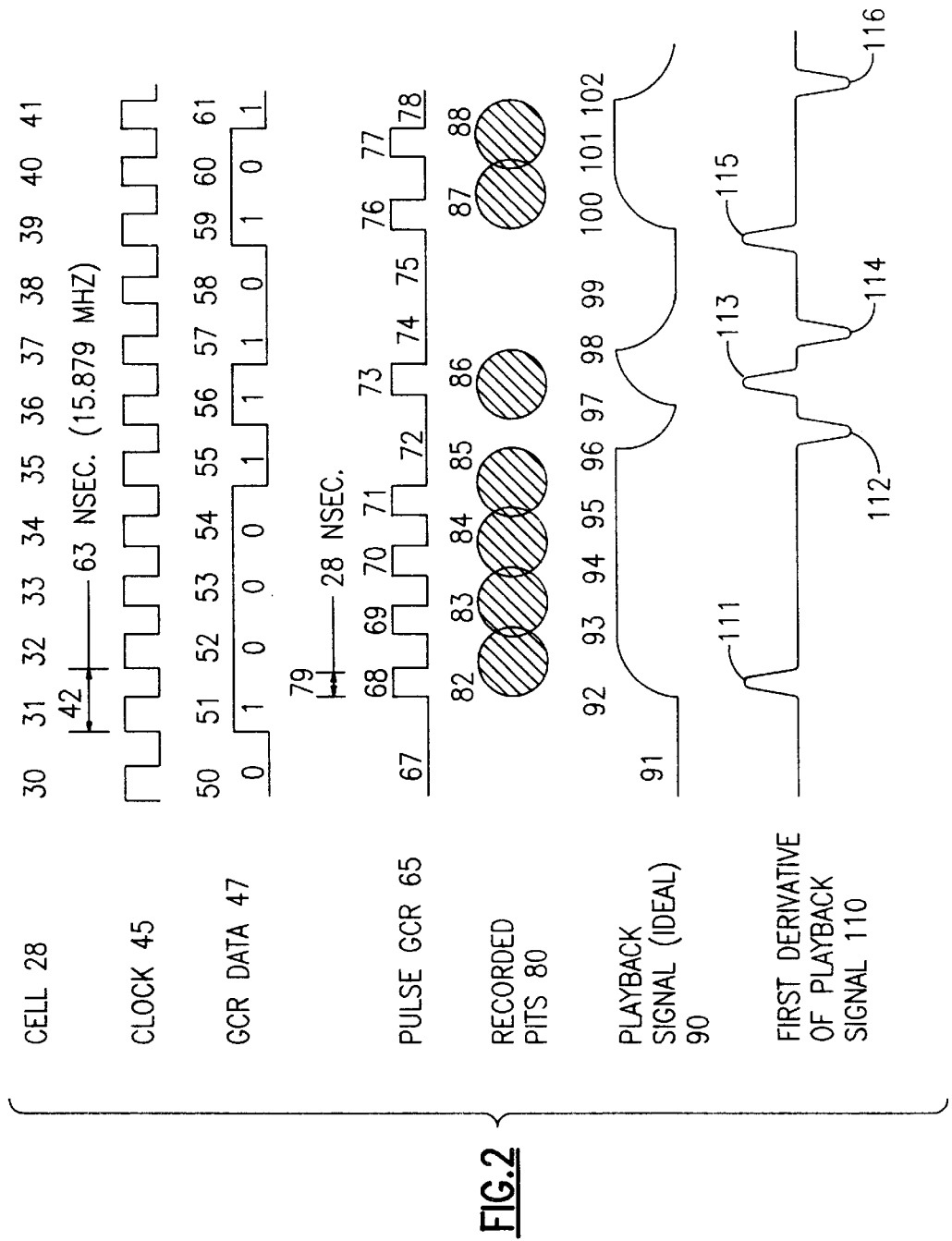
FIG. 2 is a series of sample waveforms associated with a GCR format.

FIG. 2 depicts in more detail the process of data storage and retrieval using a GCR 8/9 code format. For a GCR 8/9 code, a cell 28 is defined as one channel bit. Each clock period 42 corresponds to a channel bit; thus, cells 30 through 41 each correspond to one clock period 42 of clock waveform 45. As an example of clock speeds, for a 3½" optical disk rotating at 2,400 revolutions per minute with a storage capacity of 256 Mbytes, clock period 42 will typically be 63 nanoseconds or a clock frequency of 15.879 Mhz. GCR input waveform 47 is the encoded data output from the encoded 12 (see FIG. 1). The GCR input waveform 47 corresponds to a representative channel sequence "010001110101". The laser pulse generator 14 uses the GCR data waveform 47 to derive a pulse GCR waveform 65 (which in FIG. 2 has not been adjusted in time or duration to reflect performance enhancement for specific data patterns). Generally, the GCR pulses 67 through 78 occur at clock periods when the GCR data waveform 47 is high. The pulse GCR waveform 65 is provided to the laser 16. The magnetization of the optical medium reverses polarity as the laser is pulsed on and off (e.g., by utilizing a non-return-to-zero ("NRZ") driving signal to energize a magnetic recording head). The laser pulses resulting from GCR pulses 68, 69, 70, etc., create a pattern of recorded pits or marks 80 on optical medium 18. Thus, recorded pits 82 through 88 correspond to pulses 68, 69, 70, 71, 73, 76, and 77, respectively.

Successive recorded pits 82 through 85 may merge together to effectively create an elongated pit. The elongated pit has a leading edge corresponding to the leading edge of the first recorded pit 82 and a trailing edge corresponding to the trailing edge of last recorded pit 85.

Reading the recorded pits with an optical device such as a laser results in the generation of a playback signal 90. The playback signal 90 is low in the absence of any recorded pits. At the leading edge of a pit 86, playback signal 90 will rise and remain high until the trailing edge of the pit 86 is reached, at which point the playback signal 90 will decay and remain low until the next pit 87.

The above described process may be referred to as pulse width modulation ("PWM") because the width of the pulses in playback signal 90 indicate the distance between 1-bits. Thus, the edges of the recorded pits 80 which define the length of the pulses in playback signal 90 contain the pertinent data information. If the playback signal is differentiated, the signal peaks 111 through 116 of the first derivative signal 110 will correspond to the edges of the recorded pits 80. (The signal peaks of the first derivative playback signal 110 in FIG. 2 are shown slightly offset from the edges of the recorded pits 80 because an ideal playback signal 90 is shown). In order to recover the pit edge information from the first derivative signal 110, it is necessary to detect the signal peaks 111 through 116. Such a process is described in detail further herein.

In contrast, most if not all existing RLL 2/7 code systems are used in conjunction with pulse position modulation ("PPM"). In PPM systems, each pit represents a "1" while the absence of a pit represents a "0". The distance between pits represents the distance between 1-bits. The center of each pit corresponds to the location of the data. In order to find the pit centers, the playback signal is differentiated and the zero-crossings of the first derivative are detected. Such a technique may be contrasted with PWM systems, described above, in which the signal peaks of the first derivative contain the pertinent pulse width information.

It is nevertheless possible to utilize PWM instead of PPM with an RLL system such as an RLL 2/7 code system. Each channel bit may correspond to a clock period of a clock waveform. As with the GCR system described earlier using PWM, a "1" may be represents by a transition in the input waveform. Thus, the RLL 2/7 input waveform may remain in the same state while a "0" occurs, but changes from high-to-low or low-to-high when a "1" occurs.

In both RLL and GCR codes, as well as other codes, when data patterns are read the input signal generated from the optical reader 20 is often not symmetric. When an asymmetric signal is AC-coupled between circuits, the average DC value shifts away from the peak-to-peak midpoint. The unintended shifting away from the midpoint may result in a shift in the apparent position of the data, adversely affect the ability to determine accurately the locations of data, and reduce timing margins or render the recorded data unrecoverable.

Figure 3A:
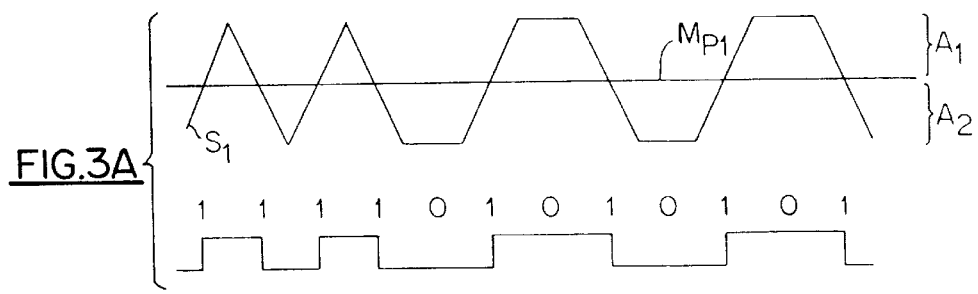
FIGS. 3A and 3B are waveform diagrams of a symmetric and asymmetric input signal, respectively.

This phenomenon may be explained with reference to FIGS. 3A and 3B. FIG. 3A shows an ideal input signal $S_1$ derived from a symmetric data pattern. Normally, transitions between 1's and 0's in the data are detected at the midpoint between high and low peaks of the input signal. It may be observed in FIG. 3A that the areas $A_1$ and $A_2$ above and below the peak-to-peak midpoint $M_{P1}$ of the input signal $S_1$ are equal, and the transitions between 1's and 0's correspond precisely (in an ideal system) to the crossings of the input signal $S_1$ and the peak-to-peak midpoint $M_{P1}$.

Figure 3B:
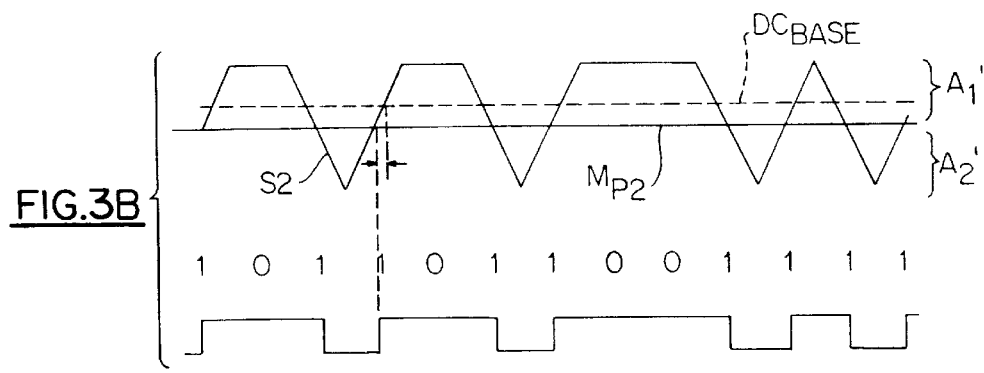

FIG. 3B, in contrast, shows an input signal $S_2$ derived from an asymmetric data pattern. It may be observed that the area $A_1'$ above the peak-to-peak midpoint $M_{P2}$ is greater than the are $A_2'$ below the graph. The input signal $S_2$ therefore has a DC component that shifts the DC baseline $DC_{base}$ above the peak-to-peak midpoint $M_{P2}$. When an attempt is made to locate transitions between 1's and 0's by determining the zero-crossings of the input signal $S_2$, errors may be made because the DC level is not identical to the peak-to-peak midpoint $M_{P2}$. The DC level does not stay constant but rises and falls depending on the nature of the input signal. The larger the DC buildup, the more the detected transitions will stray from the true transition points. Thus, DC buildup can cause timing margins to shrink or the data to be unrecoverable.

Figure 4:
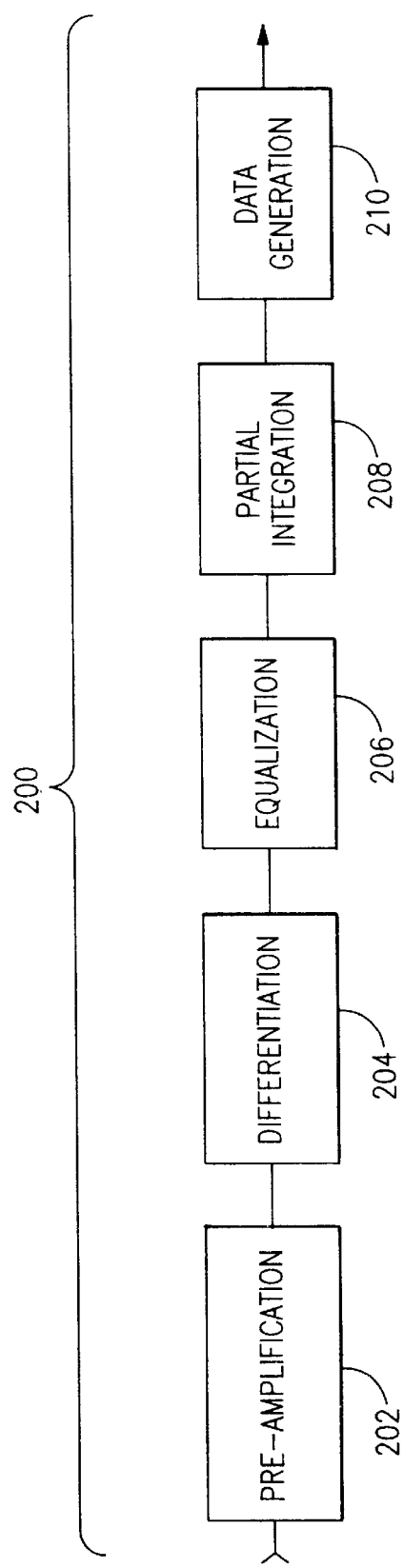
FIG. 4 is a block diagram of a read channel.

FIG. 4 is a block diagram of a read channel 200 in accordance with one embodiment of the present invention for mitigating the effects of DC buildup. The read channel 200 roughly corresponds to the waveform processor 22 of FIG. 1. The read channel 200 includes a preamplification stage 202, a differentiation stage 204, an equalization stage 206, a partial integration stage 208, and a data generation stage 210. The operation of the read channel 200 will be explained with reference to a more detailed block diagram shown in FIG. 5, the waveform diagrams shown in FIGS. 10A–10D, and various other figures as will be referenced from time to time herein.

Figure 10A:
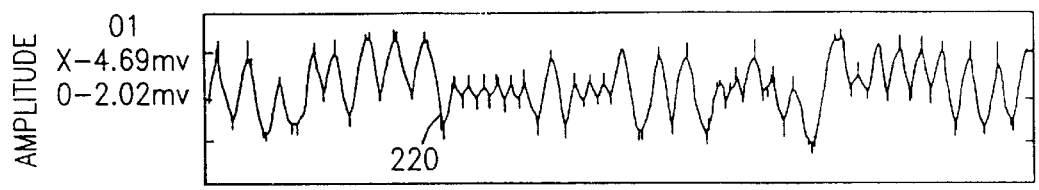
FIGS. 10A–10D are diagrams showing exemplary waveforms at various points in a read channel.

When the optical medium is scanned for data, the pre-amplification stage 202 amplifies the input signal to an appropriate level. The pre-amplification stage 202 may include a pre-amplifier 203 as is well known in the art. The pre-amplifier 203 may alternatively be located elsewhere such as within the optical reader 20. An exemplary amplified playback signal 220 is depicted in FIG. 10A.

Figure 5:
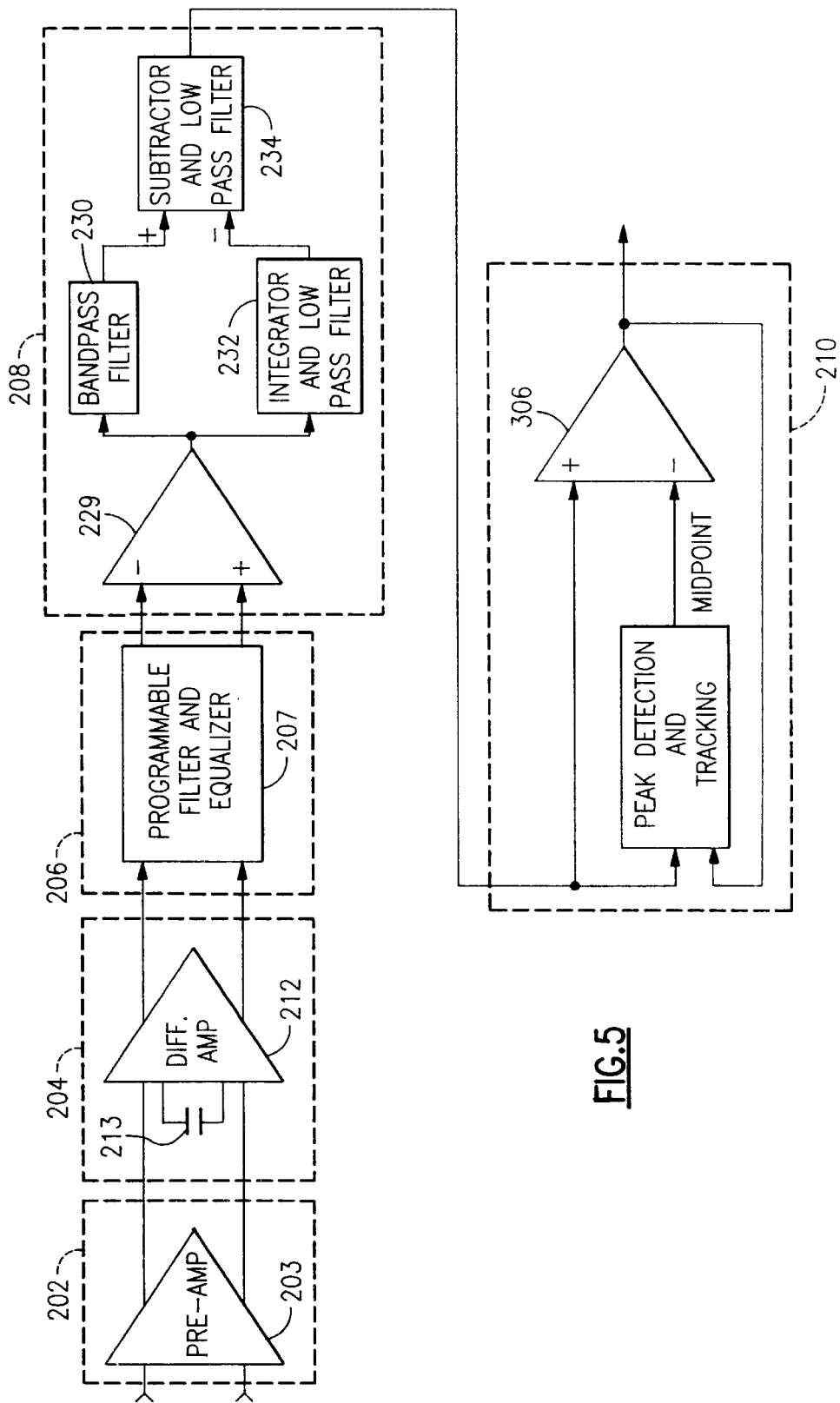
FIG. 5 is a more detailed block diagram of various stages of a read channel.
Figure 6A:
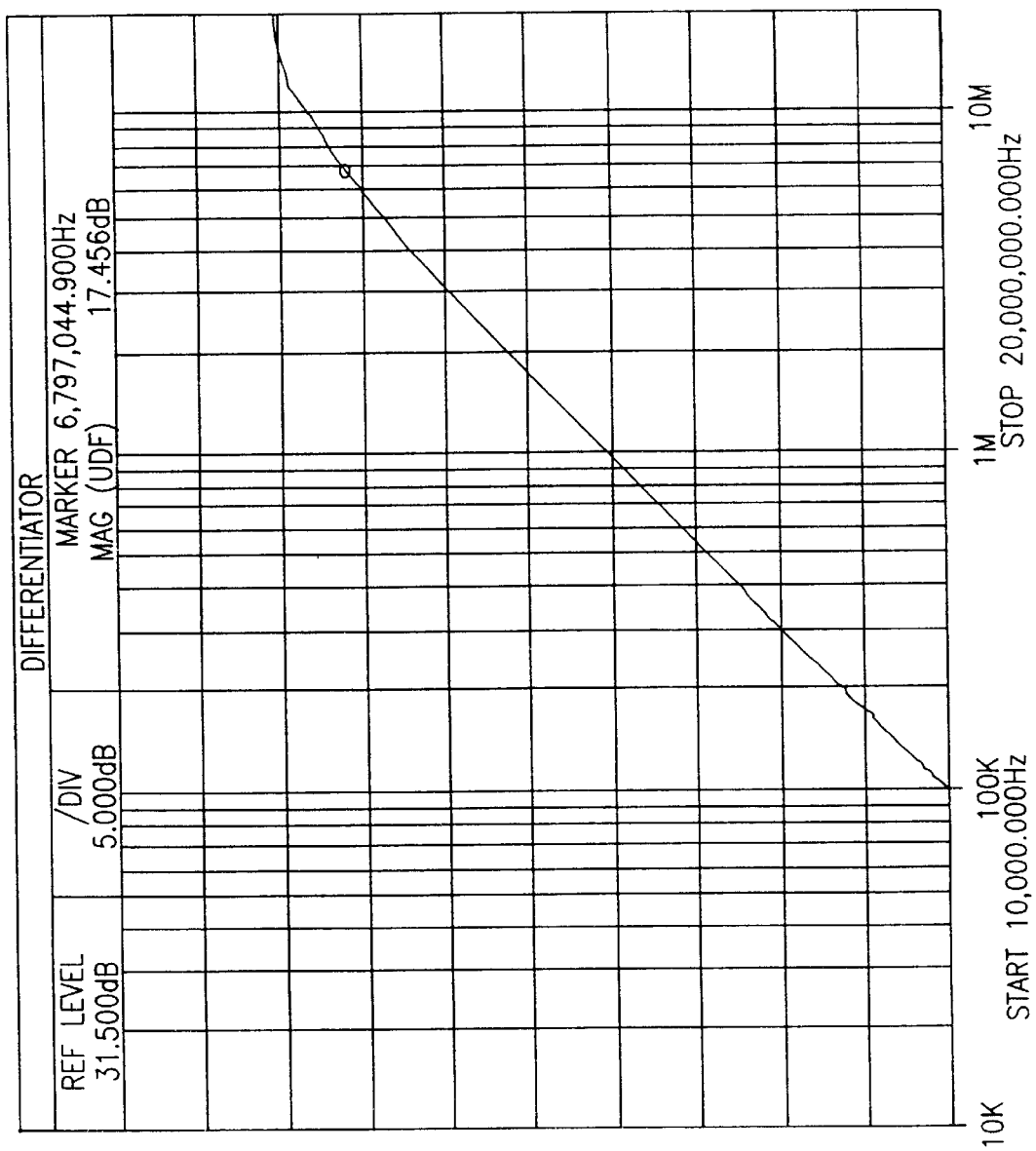
FIGS. 6A–6E are frequency response diagrams of various stages of a read channel.
Figure 10B:
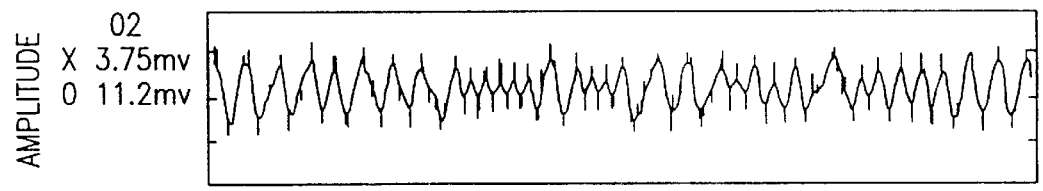

The output of the preamplification stage 202, as shown in FIG. 5, is provided to the differentiation stage 204. The differentiation stage 204 may include a differential amplifier 212 such as a video differential amplifier configured with a capacitor 213 in a manner well known in the art. A representative frequency response diagram of the differentiation stage 204 is shown in FIG. 6A. The differentiation stage 204 effectively increases the relative magnitudes of the high frequency components of the amplified playback signal 220. An exemplary waveform of the output of the differentiation stage 204 is shown in FIG 10B.

The differentiation stage 204 is followed by the equalization stage 206 as shown in FIG. 5. The equalization stage 206 provides additional filtering so as to modify the overall channel transfer function and provide mode reliable data detection. The equalization stage 206 shapes the differentiated input signal so as to even out the amplitudes of high and low frequency components and generate a smoother signal for later processing. However, equalizing filters such as equalization stage 206 often modify the noise spectrum as well as the signal. Thus, an improvement in the shape of the differentiated input signal (i.e., a reduction in distortion) is usually accompanied by a degradation in the signal-to-noise ratio. Consequently, design of the equalization stage 206 involves a compromise between attempting to minimize noise and providing a distortion-free signal at an acceptable hardware cost. In general, equalizer design depends on the amount of intersymbol interference to be compensated, the modulation code, the data recovery technique to be used, the signal-to-noise ratio, and the noise spectrum shape.

Figure 6B:
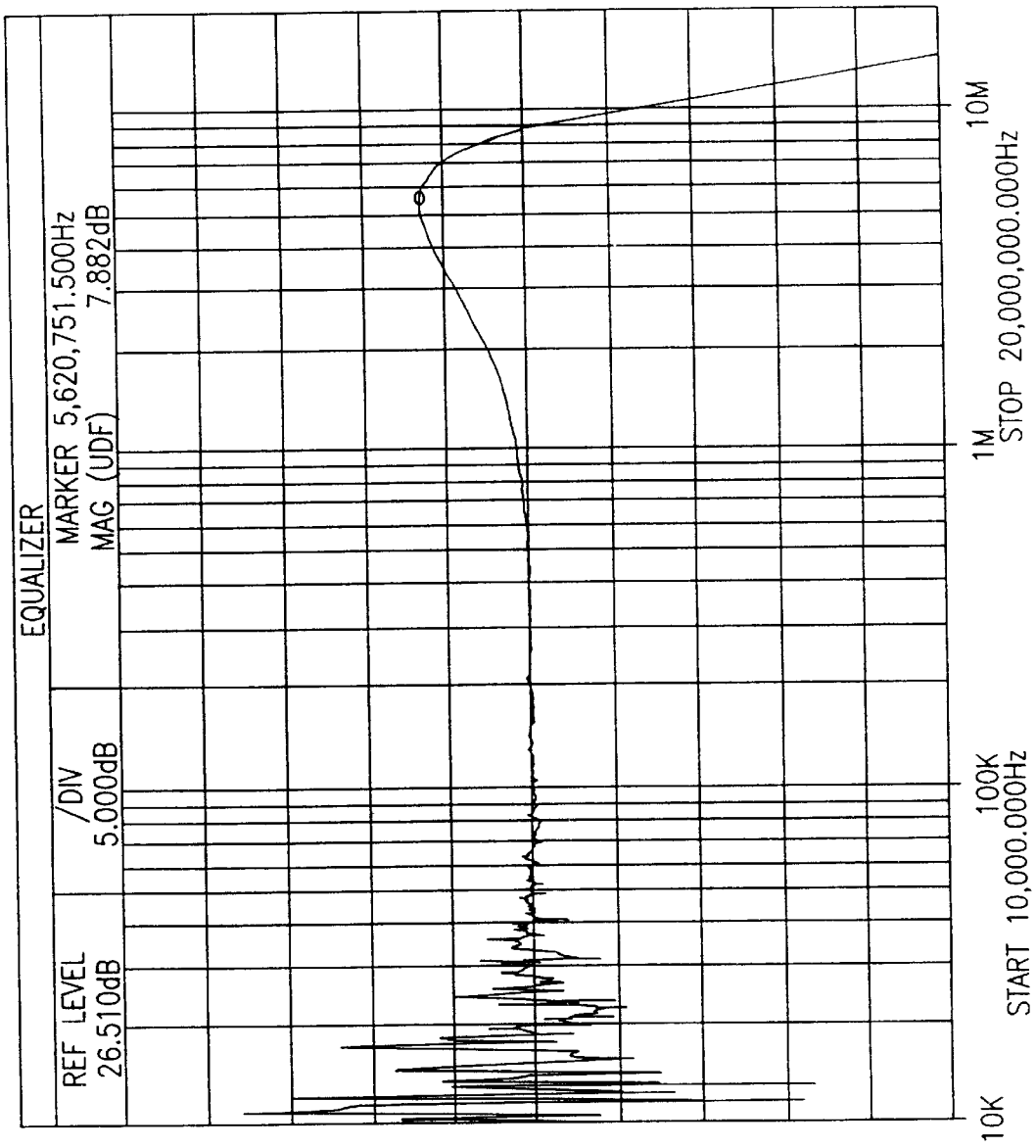

In a preferred embodiment, the equalization stage 206 my include a programmable filter and equalizer 207 located on an integrated chip. Such integrated chips are presently available from various manufacturers. The filter and equalizer 207 may be of an equi-ripple variety and have relatively constant group delay up to a frequency equal to about twice the cutoff frequency. A representative frequency response diagram of the equalization stage 204 is shown in FIG. 6B, and an exemplary output waveform is shown in FIG. 10C.

Figure 10C:
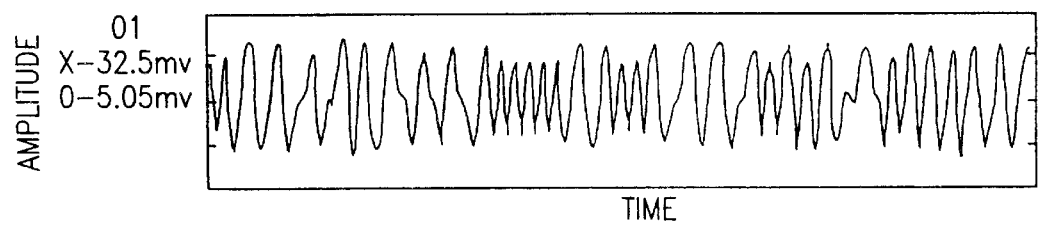

After the signal has been processed by the equalization stage 206, the signal peaks of the waveform in FIG. 10C contain accurate information regarding the position of the read data. The signal peaks can be detected by taking another derivative, but doing so may be detrimental to the system's signal-to-noise ratio and will likely cause undesired jitter. A preferred embodiment of the invention described herein provides an accurate means for detecting the signal peaks without taking a second derivative, by using partial integration and a novel data generation circuit.

Figure 6C:
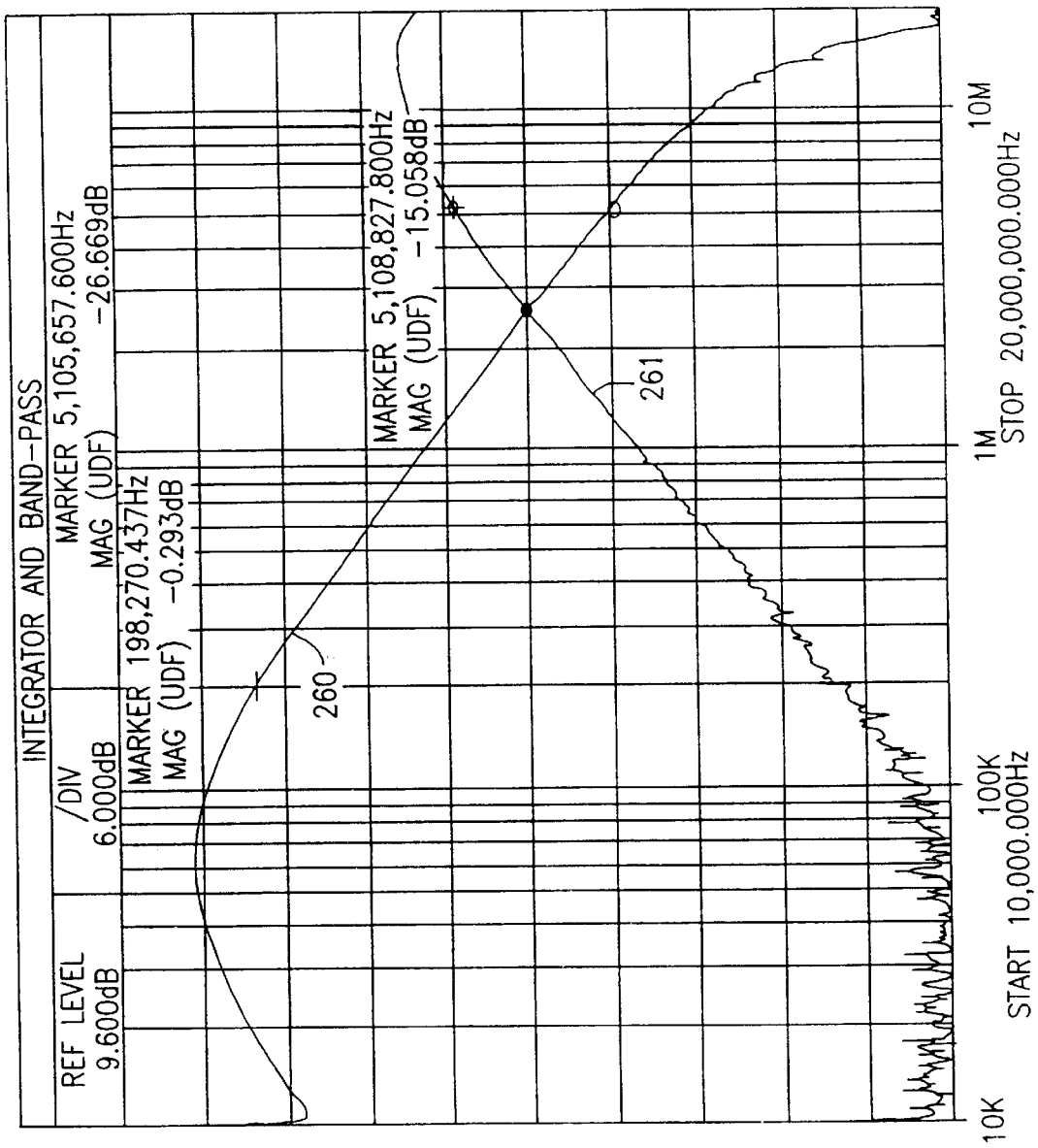
Figure 6D:
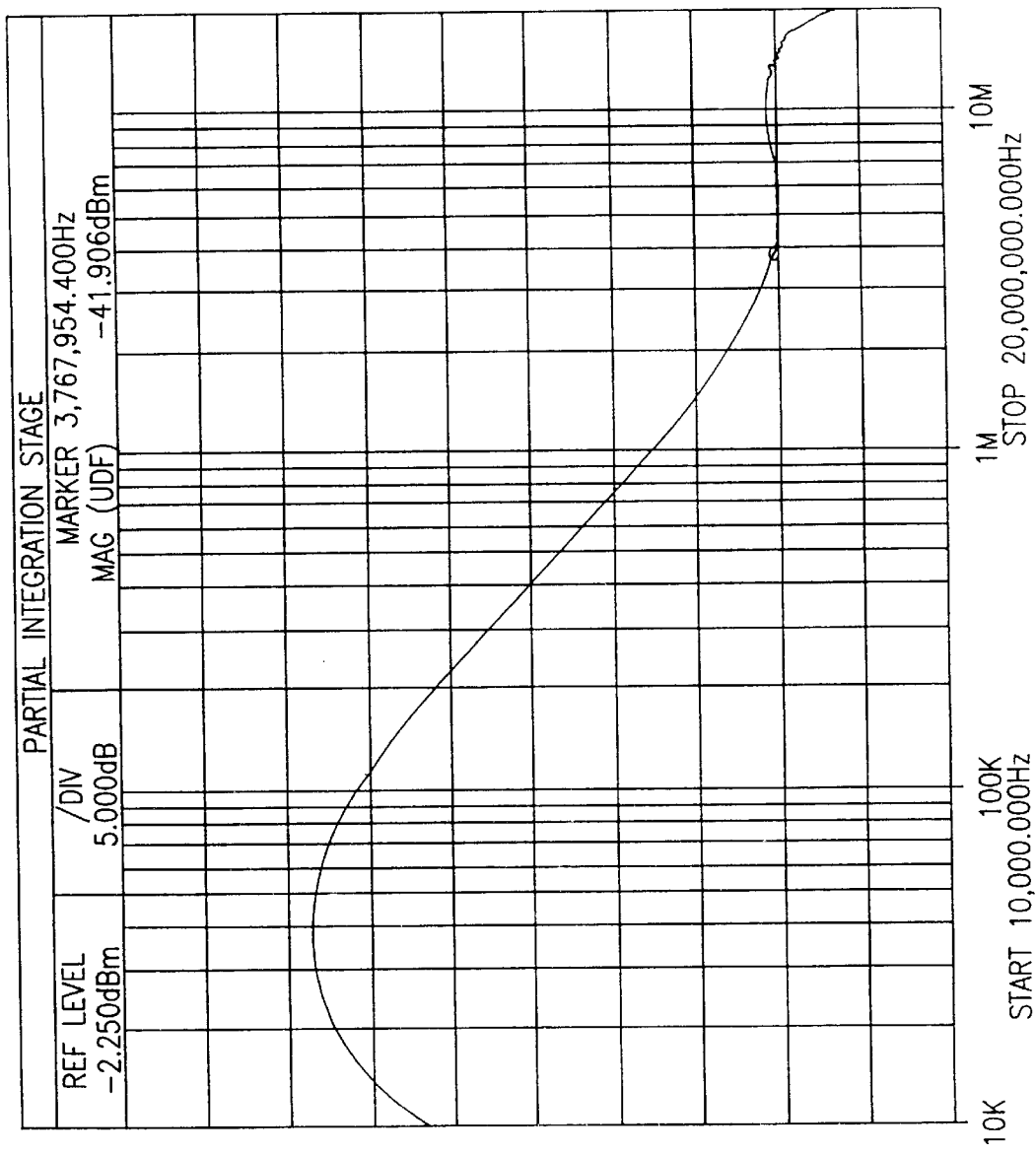
Figure 10D:
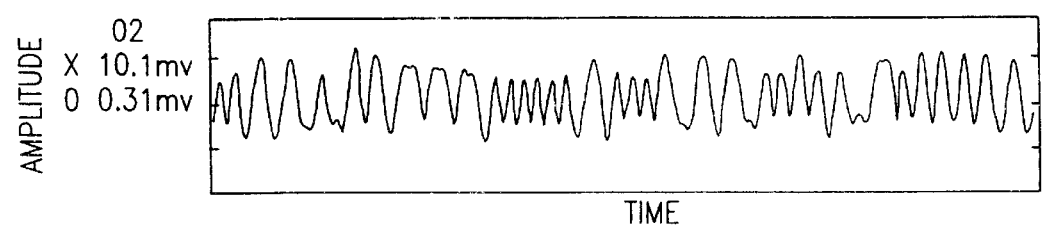

After the signal has been processed by the equalization stage 206, it is provided to the partial integrator stage 208 for further shaping of the waveform. As illustrated in FIG. 5, the partial integrator stage 208 may include an amplifier 229, a bandpass filter 230, an integrator 232, and a low pass filer 234. The amplifier 229 receives the output of the equalization stage 206 and provides a signal to the bandpass filter 230 and the integrator 232. The integrator 232 preferably attenuates a selected range of high frequency components. A representative frequency response 260 of the integrator 232 and a representative frequency response 261 of the bandpass filter 230 are depicted in FIG. 6C. The output of the bandpass filter 230 is subtracted from the output of the integrator 232 and filtered by the low pass filter 234. The total frequency response of the partial integrator stage 208, including the low pass filter 234, is shown in FIG. 6D. An exemplary output waveform of the partial integrator stage 208 is shown in FIG. 10D.

Figure 6E:
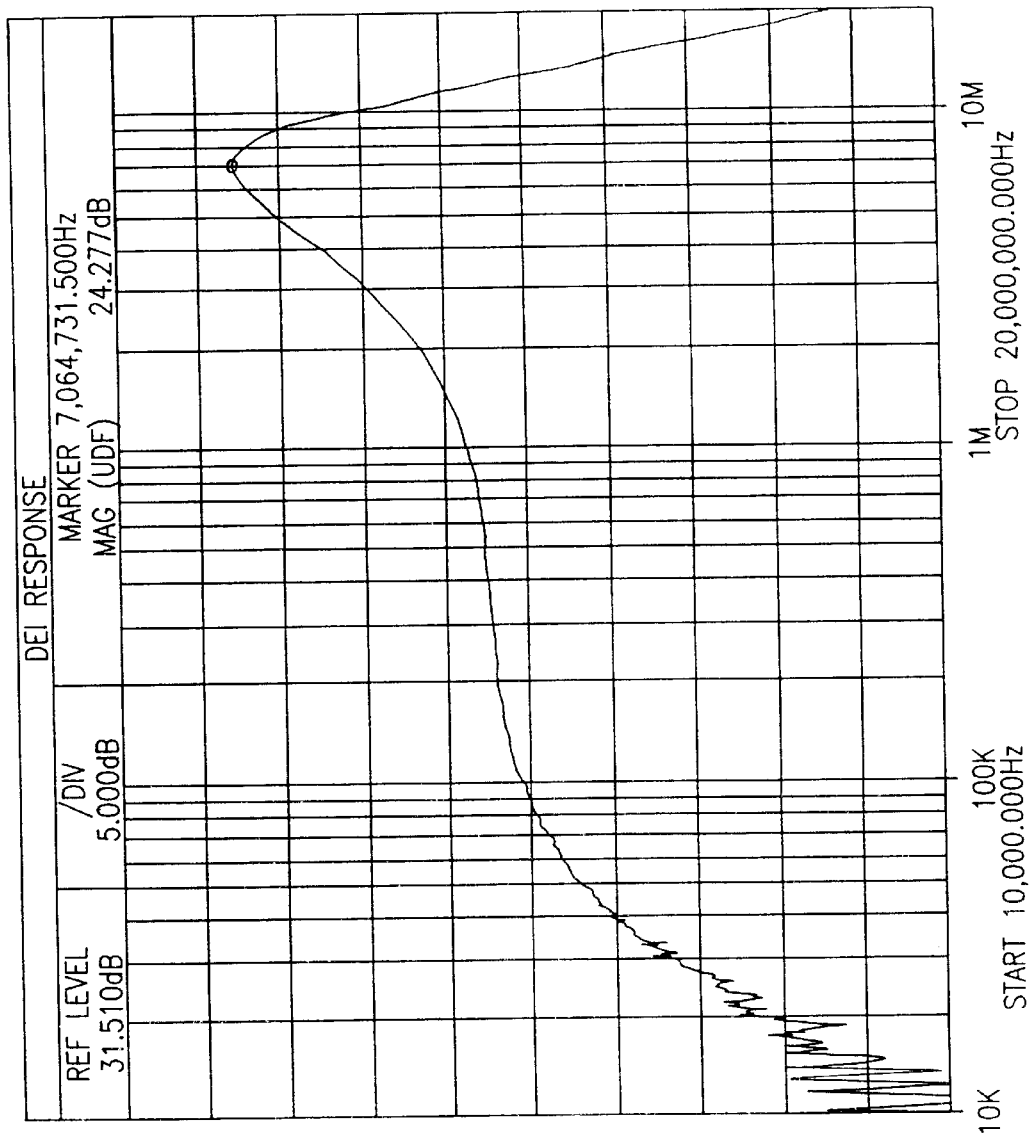

A primary function of the combination of the differentiation stage 204, the equalization stage 206, and the partial integration stage 208 is to shape the playback signal 220 in an appropriate manner for facilitating data recovery. As can be seen by comparing FIGS. 10A and 10D, the resultant signal shown in FIG. 10D is similar to the playback signal 220 of FIG. 10A (from which it was derived) but differs therefrom in that the amplitudes of its high and low frequency components have been equalized and sharp noise-like characteristics removed. The total frequency response for the combination of the differentiation stage 204, the equalization stage 206, and the partial integration stage 208 is shown in FIG. 6E.

It may be noted that tape drive systems presently exist utilizing equalization and integration of a playback signal in order to facilitate data recovery. However, to a large degree such systems do not suffer from the problems of DC buildup because they typically utilize DC-free codes. As mentioned previously, DC-free codes have the disadvantage of being relatively low in density ratio and hence inefficient. The present invention allows for the use of more efficient coding systems by providing means for eliminating the effects of DC buildup without necessarily using a DC-free code.

Figure 9:
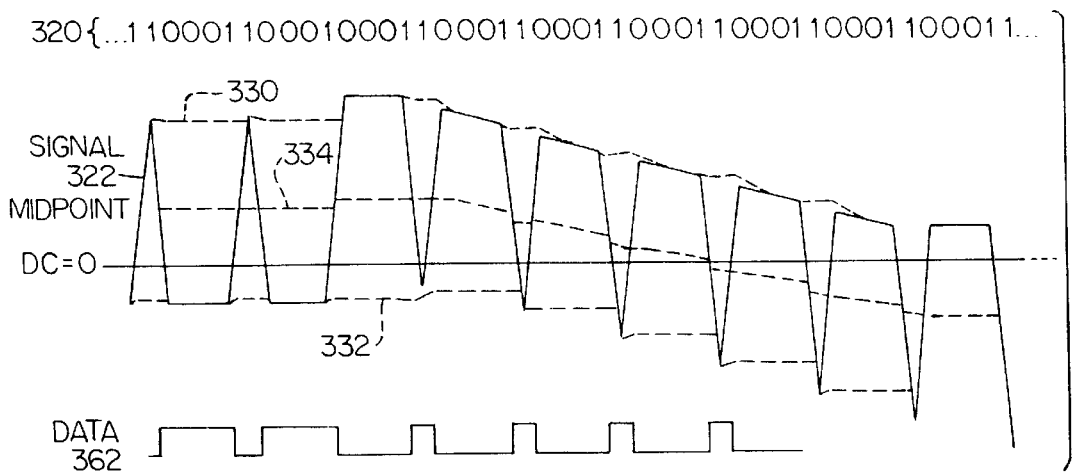
FIG. 9 is a waveform diagram showing tracking by a threshold signal of the DC envelope of an input signal.
Figure 7:
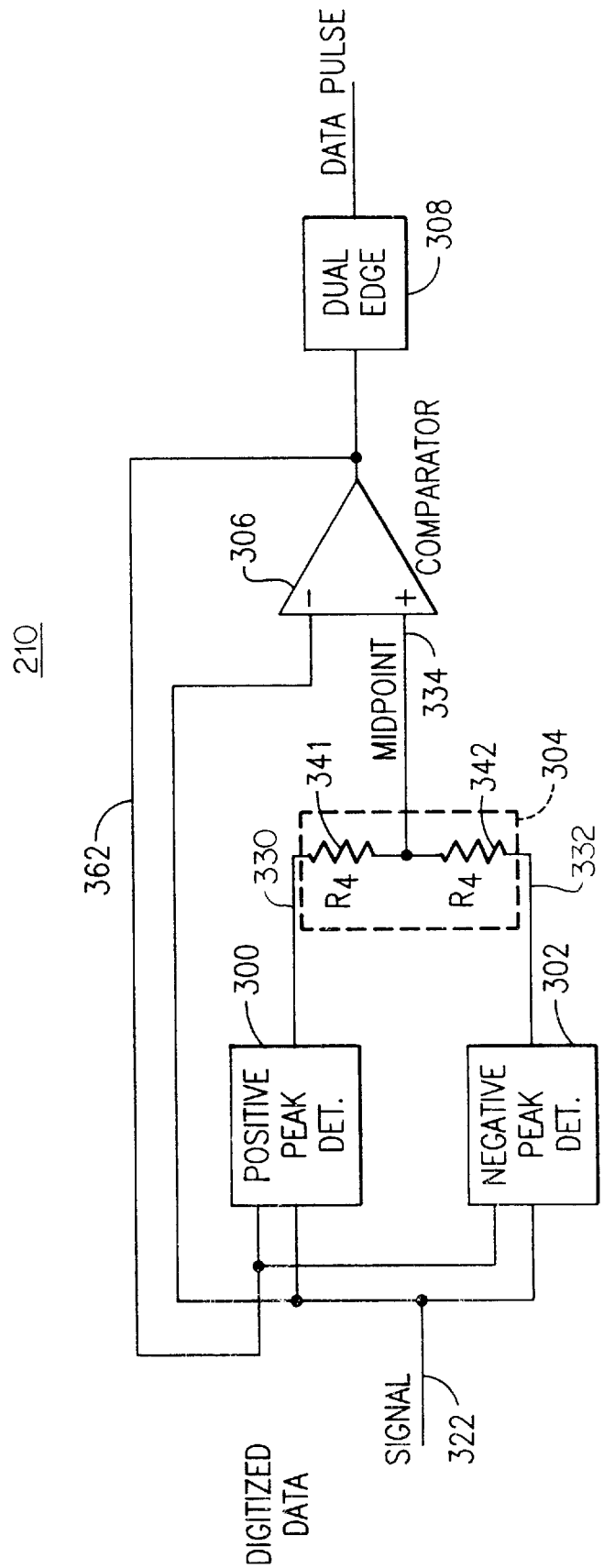
FIG. 7 is a block diagram of a peak detection and tracking circuit.

The output of the partial integrator stage 208 (e.g., the waveform in FIG. 10D) is provided to the data generation stage 210. A block diagram of the data generation stage 210 is shown in FIG. 7. The data generation stage 210 includes a positive peak detector 300, a negative peak detector 302, a voltage divider 304, a comparator 306, and a dual edge circuit 308. The separation of the circuit shown in FIG. 7 may be explained with reference to FIG. 9. In FIG. 9, it is assumed that a recovered bit sequence 320 has been read and eventually caused to be generated, in the manner as previously described, a preprocessed signal 322 from the partial integrator stage 208. It should be noted that the preprocessed signal 322 and various other waveforms described herein have been idealized somewhat for purposes of illustration, and those skilled in the art will appreciated that the actual waveforms may vary in shape and size from those depicted in FIG. 9 and elsewhere.

The preprocessed signal 322 is fed to the positive peak detector 300 and the negative peak detector 302 which measure and track the positive and negative peaks, respectively, of the preprocessed signal 322. The positive peak output signal 330 of the positive peak detector 300 and the negative peak output signal 332 of the negative peak detector 302 are depicted in FIG. 9. The positive peak output signal 330 and the negative peak output signal 332 are averaged by the voltage divider 304, which is comprised of a pair of resistors 341 and 342. The output of voltage divider 304 is utilized as a threshold signal 334 and represents the approximate peak-to-peak midpoint of the preprocessed signal 332. The output of the voltage divider 304 is provided to the comparator 306 which compares the divided voltage with the preprocessed signal 332. The comparator 306 changes states when the preprocessed signal 332 crosses the threshold signal 334, indicating a transition in the read data from a 1 to 0 or a 0 to 1. The output of comparator 306 is shown as output data waveform 362 in FIG. 9. As explained in more detail below, the output data waveform 362 is fed back to the positive peak detector 300 and negative peak detector 302 to allow tracking of the DC envelope. The output of the comparator 306 is also provided to the dual edge circuit 508 which generates a unipolar pulse of fixed duration each time the comparator 306 changes states.

The output of the dual edge circuit 308 provides clocking and data information from which recovery of the recorded data may have in a straightforward manner. For example, in a pulse-width modulation ("PWM") technique such as the GCR 8/9 modulation code described previously, each data pulse output from the dual edge circuit 308 represents a transition in flux (i.e., a recorded 1-bit), while the lack of data pulse at clock interval would represent the lack of transition in flux (i.e., a recorded 0-bit). The sequence of recorded bits can thereafter be decoded by decoder 24 (shown in FIG. 1) by methods well known in the art to determine the original data.

In order to properly track the envelope caused by the DC portion of the preprocessed signal 322, the preferred embodiment feeds back duty cycle information from the comparator output signal 362 to the positive and negative peak detectors 300 and 302. This process may be explained further by reference to FIG. 16 which depicts a more detailed circuit diagram of the data detection stage 210. As shown in FIG. 16, the preprocessed signal 322 is provided to the base of transistors Q2 and Q5. Transistor Q2 is associated with the positive peak detector 300, and transistor Q5 is associated with the negative peak detector 302. Because the positive peak detector 300 and negative peak detector 302 operate in an analogous fashion, the duty cycle feedback operation will be explained only with reference to the positive peak detector 300, while those skilled in the art will understand by perusal of FIG. 16 and the description below the analogous operation of negative peak detector 302.

Transistor Q2 charges a capacitor C1 when the amplitude of the preprocessed signal 322 exceeds the stored voltage of the capacitor C1 (plus the forward bias voltage of the transistor Q2). In FIG. 9, it can be seen that the positive peak output signal 330 always charges rapidly to the peak of the signal 332. The output signal 362, through feedback, maintains the positive charge on the capacitor C1 when the output signal 362 is high and allows the capacitor C1 to discharge when the output signal 362 is low. Thus, if the output signal 362 is high, the positive charge on capacitor C1 is maintained by transistor Q1 through resistor R2. Preferably, resistors R1 and R2 are selected to be the same value so that charge is added to the capacitor through resistor R2 at the same rate that it is discharged through resistor R1, thus maintaining as constant the net charge on capacitor C1. If, on the other hand, the output signal 362 is low, then transistor Q1 is turned off and capacitor C1 is allowed to discharge though resistor R1. The values of capacitor C1 and resistor R1 are preferably selected such that the time constant is slightly faster than the speed of expected DC buildup so that the capacitor C1 can track the change in DC level as it occurs.

The output of capacitor C1 is provided to the base of transistor Q3. The voltage level of the emitter of Q3 is a bias voltage level above the output of capacitor C1. Current is drawn through resistor R3 which allows the emitter of transistor Q3 to follow the voltage of the capacitor C1 (offset by the emitter-base bias voltage). Thus, the emitter of transistor Q3 yields positive peak output signal 330. It should be noted that transistors Q1 and Q2 are NPN type transistors while Q3 is a PNP type resistor. Thus, the NPN-PNP configuration largely cancels out adverse thermal effects that may be experienced with transistors Q1, Q2 and Q3 and also cancels out the bias voltages associated with their operation.

The negative peak detector 302 operates in an analogous fashion to the positive peak detector 300 and is therefore not explained in grater detail. The emitter of transistor Q6 yields negative peak output signal 332.

Figure 8:
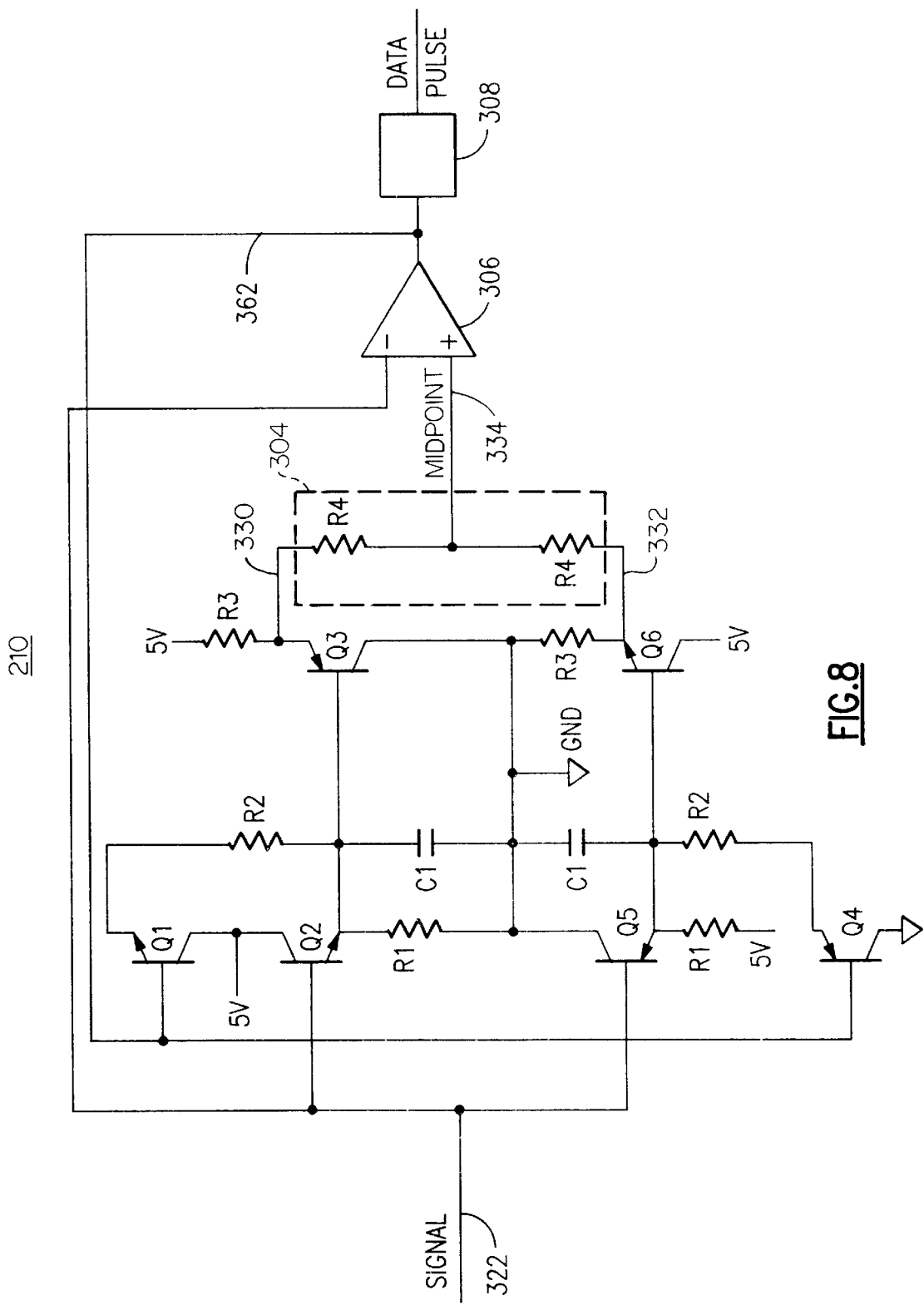
FIG. 8 is a schematic diagram of the peak detection and tracking circuit of FIG. 7.

As described previously, positive peak output signal 330 and negative peak output signal 332 are averaged by the voltage divider 304 comprised of pair of resistors R4 as shown in FIG. 8 to form threshold signal 334. The threshold signal 334 therefore constitutes the approximate midpoint of the peak-to-peak value of the preprocessed signal 322 tracks the DC envelope of the preprocessed signal 322 through duty cycle feedback compensation.

Although the duty cycle feedback has been shown in the preferred embodiment as originating from the output of the comparator 306, it may be observed by those skilled in the art that other feedback paths may be utilized without departing from the scope of the invention. For example, a similar feedback path may be taken from the output of dual edge circuit 308 if a flip/flop or other memory element is placed at the output of the dual edge circuit 308. Also, other means for measuring duty cycle and adjusting the threshold signal to track the DC envelope may be utilized.

It will be appreciated that the various circuits and methods described herein are not limited to magneto-optical systems but may also be useful in systems for reading data on stored tapes and other types of disks as well and, in a more general sense, in any system (whether or not a data storage system) for processing electrical signals in which it is desired to mitigate the effects of DC buildup.

While this invention has been described in detail with reference to certain preferred embodiments, it should be appreciated that the present invention is not limited to those precise embodiments. Rather, in view of the present disclosure which describes the current best mode for practicing the invention, many modifications and variations would present themselves to those of skill in the art without departing from the scope and spirit of this invention. The scope of the invention is, therefore, indicated by the following claims rather than by the foregoing description. All changes, modifications, and variations coming within the meaning and range of equivalency of the claims are to be considered within their scope.

What is claimed is:

1. An apparatus comprising:
    an input stage for programmably equalizing an input signal having a DC component to produce an equalized signal;
    an integration stage for integrating the equalized signal to produce a preprocessed signal; and
    a data output stage for generating an output signal using the preprocessed signal and a threshold signal, the threshold signal being an approximately peak-to-peak midpoint of the preprocessed signal.

2. The apparatus of claim 1 wherein the data output stage comprises a tracking device for tracking the DC component from the preprocessed signal.

3. The apparatus of claim 1 wherein the integrating stage comprises a bandpass filter and an integrator to filter and integrate the equalized signal respectively, and a subtractor to subtract the integrated signal from the filtered signal to produce the preprocessed signal.

4. The apparatus of claim 3 further comprises a first lowpass filter for filtering the integrated signal.

5. The apparatus of claim 4 further comprises a second low pass filter for filtering the preprocessed signal.

6. The apparatus of claim 5 wherein the dual edge circuit provides clocking of embedded data information of the input signal.

7. The apparatus of claim 3 further comprises an amplifier for amplifying the equalized signal and feeding the amplified signal to the bandpass filter and integrator.

8. The apparatus of claim 1 wherein the preprocessed signal comprises positive peaks and negative peaks.

9. The apparatus of claim 1 further comprising a dual edge circuit for generating a unipolar pulse having a fixed duration each time the output signal changes states.

10. The apparatus of claim 9 wherein the dual edge circuit provides clocking embedded data information of the input signal.

11. The apparatus of claim 1 wherein the input stage includes an amplifier and differentiator for amplifying and differentiating the input signal.

12. A method comprising:

producing an equalized signal from an input signal having a DC component, wherein producing the equalized signal includes programmable filtering and equalizing the input signal;

generating a preprocessed signal wherein generating comprises bandpass filtering and integrating the equalized signal to produce a filtered signal and an integrated signal respectively, and subtracting the integrated signal from the filtered signal to produce the preprocessed signal; and generating an output signal using the preprocessed signal and a threshold signal.

13. The method of claim 12 wherein producing the equalized signal comprises producing an equi-ripple frequency response.

14. The method of claim 12 wherein integrating the equalized signal further comprises low pass filtering the integrated signal.

15. The method of claim 14 further comprises lowpass filtering the preprocessed signal.

16. The method of claim 14 further comprising amplifying the equalized signal and feeding the amplified signal to the bandpass filter and integrator.

17. The method of claim 14 further comprising generating a unipolar pulse of fixed duration each time the output signal changes states.

18. The method of claim 14 wherein the threshold signal represents an approximately peak-to-peak midpoint of the preprocessed signal.

19. The method of claim 12 wherein the preprocessed signal comprises positive and negative peaks, the positive and negative peaks being detected by a detector for generating the threshold signal.

20. The method of claim 12 wherein the threshold signal represents an approximately peak-to-peak midpoint of the preprocessed signal.

21. The method of claim 12 further comprising generating a unipolar pulse of fixed duration each time the output signal changes states.

22. The method of claim 21 wherein the output signal includes data information embedded in the input signal.

* * * * *